United States Patent
Seo et al.

(10) Patent No.: US 7,120,058 B2
(45) Date of Patent: Oct. 10, 2006

(54) CIRCUIT AND METHOD FOR CONTROLLING BOOSTING VOLTAGE

(75) Inventors: Myoungkyu Seo, Suwon-Si (KR); Hyosang Lee, Yongin (KR)

(73) Assignee: Samsung Electronics Co., Ltd. (KR)

(*) Notice: Subject to any disclaimer, the term of this patent is extended or adjusted under 35 U.S.C. 154(b) by 67 days.

(21) Appl. No.: 11/042,608

(22) Filed: Jan. 25, 2005

(65) Prior Publication Data
US 2005/0254304 A1 Nov. 17, 2005

(30) Foreign Application Priority Data
May 14, 2004 (KR) .................. 10-2004-0034286

(51) Int. Cl.
*G11C 16/04* (2006.01)
(52) U.S. Cl. ................ 365/185.18; 365/189.07; 365/185.33
(58) Field of Classification Search .......... 365/185.18, 365/185.33, 189.07, 185.09
See application file for complete search history.

(56) References Cited

U.S. PATENT DOCUMENTS

| 6,208,198 | B1 | 3/2001 | Lee |
| 6,404,274 | B1 | 6/2002 | Hosono et al. |
| 6,738,291 | B1 * | 5/2004 | Kamei et al. .......... 365/185.18 |
| 2003/0172309 | A1 | 9/2003 | Cioaca |

FOREIGN PATENT DOCUMENTS

WO  WO 02/019342  3/2002

* cited by examiner

*Primary Examiner*—Huan Hoang
(74) *Attorney, Agent, or Firm*—F. Chau & Associates, LLC

(57) ABSTRACT

A circuit for use in a memory device is provided, comprising: a level detector that receives a plurality of programming input signals, detects which of the programming input signals are active, and outputs detected signals of varying weight dependant upon the number of programming input signals which are active; a signal generator that receives the detected signals from the level detector and outputs a generated signal having a varying voltage level proportional to the varying weight of the detected signals; and a voltage booster that controls a voltage level of a bias source based on the generated signal.

28 Claims, 10 Drawing Sheets

CIRCUIT AND METHOD FOR CONTROLLING BOOSTING VOLTAGE

TECHNICAL FIELD

The present invention relates generally to a flash memory device, more particularly, to a circuit and method for controlling boosting voltage.

DISCUSSION OF RELATED ART

There are generally three operation modes in a flash memory, i.e. read, program and erase. Depending on the type of flash memory, each mode typically uses a different bias voltage. For example, a split gate cell type flash memory is programmed by using source side hot carrier injection, which injects a program current in the memory cell from the source to the drain. A boosting voltage is used to provide the program current. The boosting voltage is typically higher than the voltage required for a data read operation. A different voltage is used to generate an electric field sufficient for an erase operation.

FIG. 1 shows a conventional split gate flash memory cell array. The cells of the flash memory when left unprogrammed has a data "1" value. To program data "0" in a memory cell, such as in (M5), the source line (SL) is connected to the boosting voltage (VPP), the word line (WL2) is connected to a slightly lower boosting voltage. The bit line (BL1) is connected to a logic "0" level, and the pass transistor (P1) is turned on by activating voltage at (A1). With the above applied voltages, the memory cell (M5) is turned-on, and the program current (I) flows from the source (SL) to bit line (BL1). The hot carrier which is generated by the program current (I) injects to the split gate and programs the memory cell (M5). Since a large number of cells are commonly connected to the source line, if many cells are to be programmed with data "0" simultaneously, the total program current has to be increased and the voltage level at the source line (SL) can be lowered due to the large load. The boosting voltage (VPP) connected to the source line (SL) has to be increased to accommodate this condition. However, if the boosting voltage (VPP) is increased, a larger than needed amount of injection current flows when there is a smaller number of memory cells needed to be programmed with data "0". In such instance, the programmed memory cells are subject to a higher amount of stress due to the high boosting voltage (VPP) and program current. The operational lifetime of the stressed memory cells may shorten.

FIG. 2 shows a conventional boosting voltage circuit for providing a boosting voltage VPP. The boosting voltage circuit 200 includes a voltage boost portion 21, which in turn includes an oscillator 211 and a pumping circuit 213. The pumping circuit 213 outputs a boosting voltage VPP at varied levels when it is oscillated by oscillator 211, and outputs a predetermined high level when the oscillator is blocked and the charge pump (not shown) in the pumping circuit is stopped. Through level detector 23, a detected portion of the boosting voltage VPP is output at VDET. When the detected VDET signal is higher than a reference voltage VREF, the HVDET signal is at a high level, and the OSC output of the oscillator 211 is blocked, and the output of NOR gate (212) is at logic "0". The charge pumping at the pumping circuit 213 is stopped and VPP is output at a predetermined high level. By use of the conventional boosting voltage circuit, the boosting voltage control is coarsely controlled, depending on the feedback of a portion of the boosting voltage coarsely detected. With such conventional boosting voltage circuit, individual cells of a memory cell array may still be subject to an unnecessary level of stress from high injection current when there are differences in the number of cells to be programmed with data "0" from one cell array to the next.

A need therefore exists for a circuit and method for controlling a boosting voltage to provide programming current suitable for varying amounts of cells to be programmed.

SUMMARY OF THE INVENTION

A circuit is provided for use in a memory device, comprising a level detector that receives a plurality of programming input signals, detects which of the programming input signals are active, and outputs detected signals of varying weight dependant upon the number of programming input signals which are active; a signal generator that receives the detected signals from the level detector and outputs a generated signal having a varying voltage level proportional to the varying weight of the detected signals; and a voltage booster that controls a voltage level of a bias source based on the generated signal.

The circuit wherein the level detector includes: a plurality of input transistors that receive the respective plurality of programming input signals; and a first resistor network that connects to the plurality of input transistors to output at each of a plurality of network nodes a portion of a fixed voltage dependant upon the number of programming input signals which are active.

The circuit further includes a comparator that connects to the plurality of network nodes, compares the voltage levels at the network nodes against a reference voltage, and outputs the detected signals of varying weight based on the voltage levels at the network nodes.

The circuit wherein the signal generator includes a plurality of receiving transistors that receive the respective detected signals, the receiving transistors connect to a second resistor network that is biased by the bias source, the second resistor network having a node that outputs the generated signal.

The circuit wherein the voltage booster includes a comparator that compares the voltage level of the generated signal against a reference voltage to output a compared signal that at one level causes an increase in the voltage of the bias source and at another level does not increase the voltage of the bias source.

The circuit wherein the memory is a flash memory.

The circuit wherein the flash memory is one of a split gate type and a stack gate type.

The circuit wherein the bias source is used to supply current to program the flash memory.

The circuit wherein the voltage level of the bias source is increased proportionally as the number of programming inputs which are active increases.

A method of controlling a bias source in a memory device is also provided, comprising receiving a plurality of programming input signals; generating detected signals of varying weight dependant upon the number of programming input signals which are active; generating a generated signal having a varying voltage level proportional to the varying weight of the detected signals; and controlling a voltage level of the bias source based on the generated signal.

The method further includes receiving at a plurality of input transistors the respective plurality of programming input signals, the input transistors connect to a resistor network to output at each of a plurality network nodes a portion of a fixed voltage dependant upon the number of programming input signals which are active.

The method further includes comparing the voltage levels at the network nodes against a reference voltage, and generating the detected signals of varying weight based on the voltage levels at the network nodes.

The method further includes receiving at a plurality of receiving transistors the respective detected signals, the receiving transistors connect to a resistor network that is biased by the bias source, the resistor network having a node that outputs the generated signal.

The method further comprises comparing the voltage level of the generated signal against a reference voltage to output a compared signal that at one level causes an increase in the voltage of the bias source and at another level does not increase the voltage of the bias source.

The method wherein the memory is a flash memory.

The method wherein the flash memory is one of a split gate type and a stack gate type.

The method wherein the bias source is used to supply current to program the flash memory.

The method wherein the voltage level of the bias source is increased proportionally as the number of programming inputs which are active increases.

According to another aspect of the disclosure, a circuit is provided for use in a memory device, comprises means for receiving a plurality of programming input signals, detecting which of the programming input signals are active, and outputting detected signals of varying weight dependant upon the number of programming input signals which are active; means for receiving the detected signals and outputting a generated signal having a varying voltage level proportional to the varying weight of the detected signals; and means for controlling the voltage level of a bias source based on the generated signal.

The circuit wherein the memory is a flash memory.

The circuit wherein the flash memory is one of a split gate type and a stack gate type.

The circuit wherein the bias source is used to supply current to program the flash memory.

The circuit wherein the voltage level of the bias source is increased proportionally as the number of programming inputs which are active increases.

A circuit for use in a memory device, comprises an input measurer that receives a plurality of programming input signals and outputs a generated signal having a varying voltage level in response to the plurality of programming input signals which are active; and a voltage booster that controls a voltage level of a bias source based on the generated signal.

The circuit wherein the memory is a flash memory.

The circuit wherein the flash memory is one of a split gate type and a stack gate type.

The circuit wherein the bias source is used to supply current to program the flash memory.

The circuit wherein the voltage level of the bias source is increased proportionally as the number of programming inputs which are active increases.

BRIEF DESCRIPTION OF THE DRAWINGS

The features of the present invention will become understood by those having ordinary skill in the art by describing, in detail, exemplary embodiments thereof with reference to the attached drawings, wherein like elements are represented by like reference numerals.

DETAILED DESCRIPTION OF PREFERRED EMBODIMENTS

Figure 1:
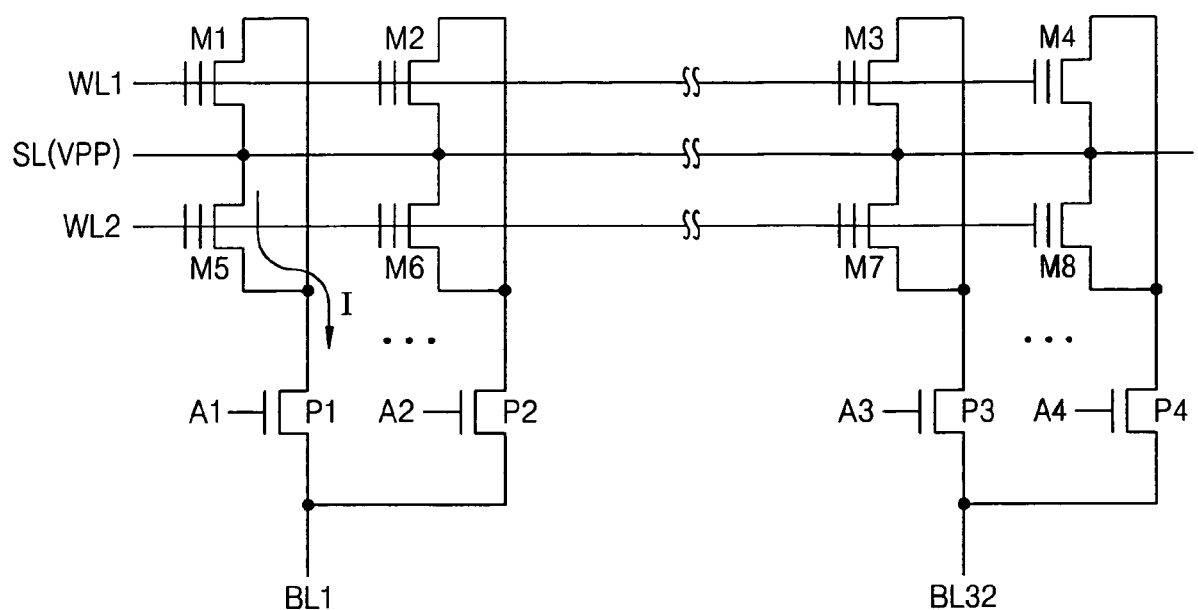
FIG. 1 shows a conventional split gate flash memory cell array.
Figure 2:
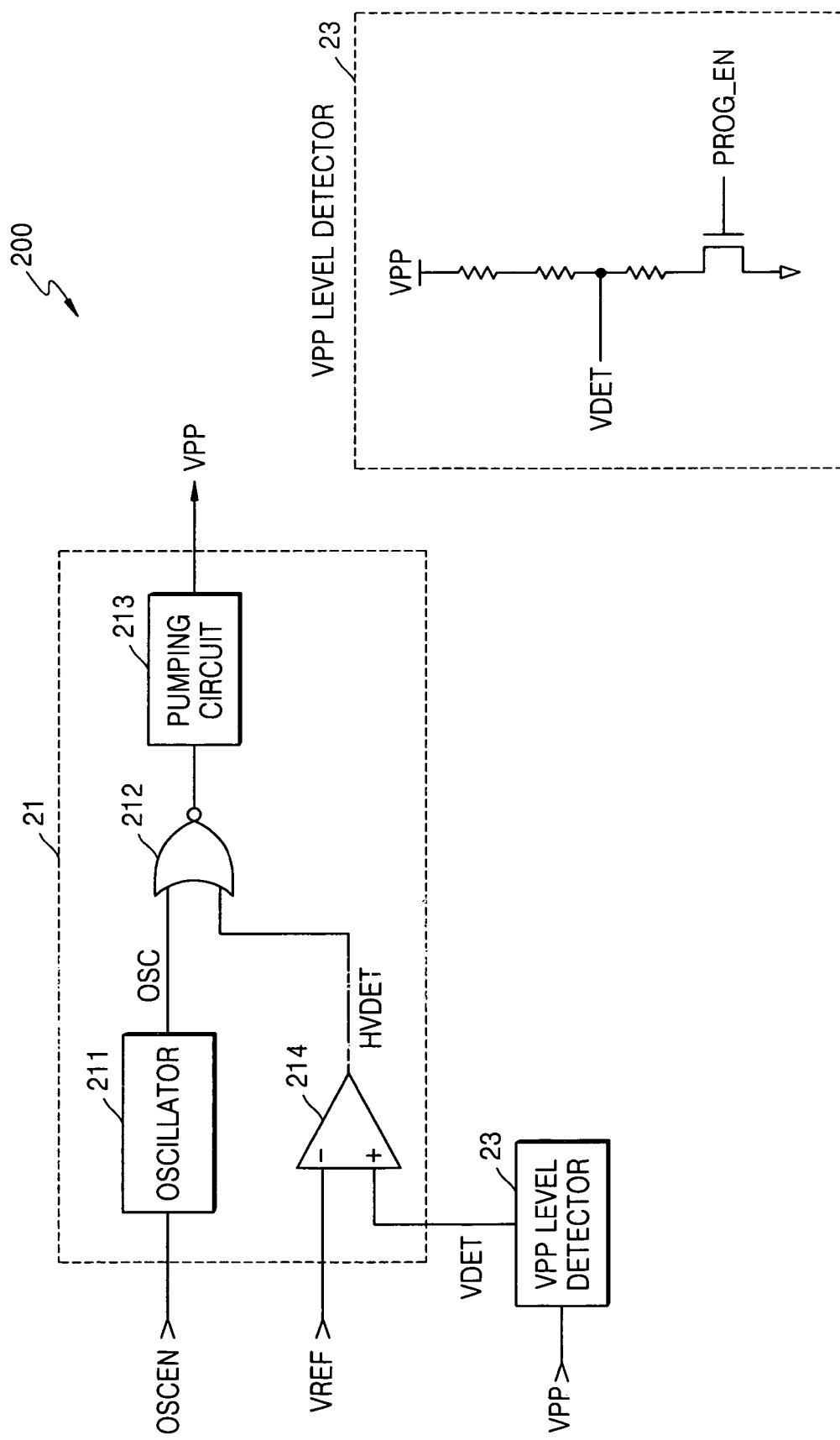
FIG. 2 shows a conventional boosting voltage circuit for providing a boosting voltage.
Figure 3:
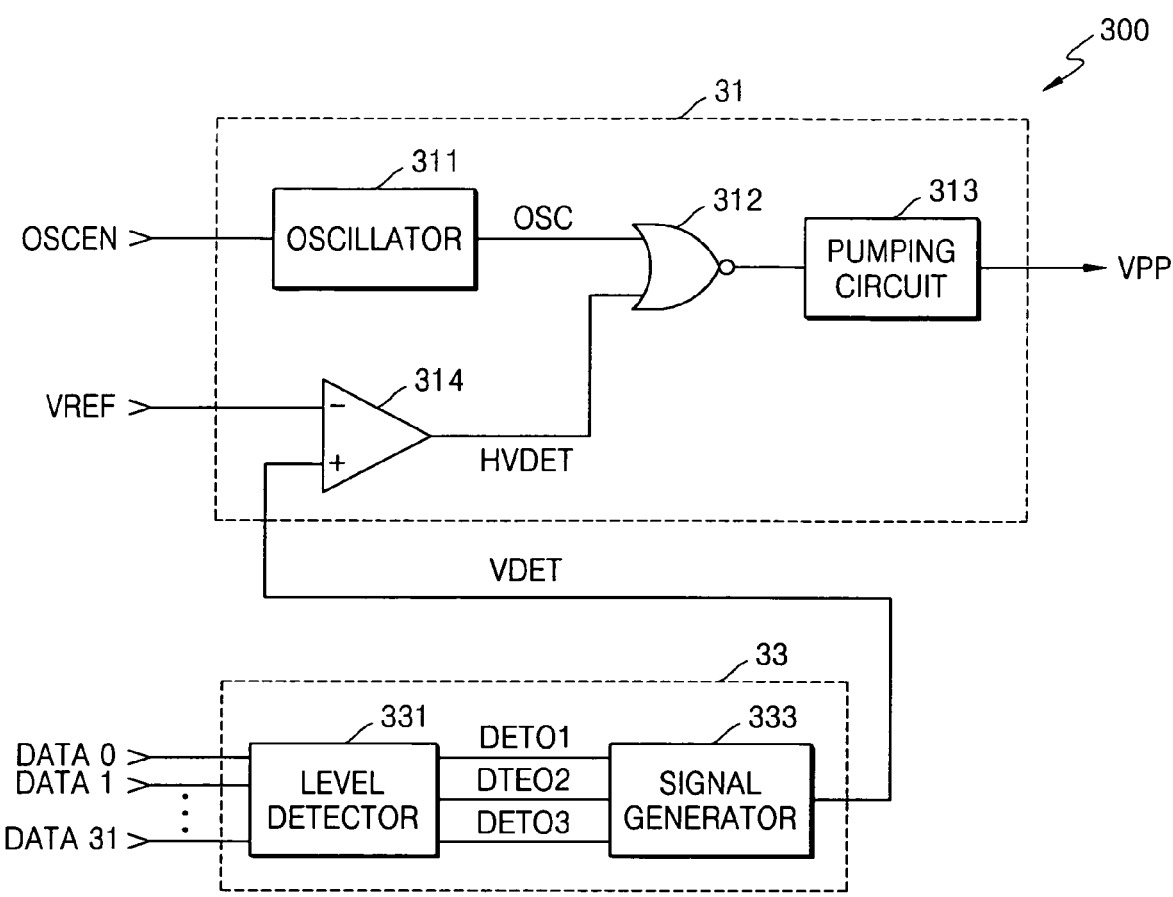
FIG. 3 shows a boosting voltage circuit according to an embodiment of the present invention.

FIG. 3 shows a boosting voltage circuit according to an embodiment of the present invention. The boosting voltage circuit 300 comprises a pump control circuit 31 and a boost voltage and program input detect circuit (hereafter "detector circuit") 33. The pump control circuit 31 includes oscillator 311 for providing an oscillating signal to pumping circuit 313 to output a boosting voltage VPP at varying levels. The oscillation signal output at the oscillator 311 can be blocked at NOR gate 312 by a high level input from the operational amplifier 314 at HVDET. The inputs of the amplifier 314 are reference voltage VREF and boosting detect VDET output from the detector circuit 33.

The detector circuit 33 includes a level detector 331 and a signal generator 333. The level detector 331 receives input data DATA(0) to DATA(n) and outputs DET(x) signals, representing a weight of the number of DATA0 to DATAn signals to be programmed. The signal generator 333 receives the DETx signals and outputs the boosting detect VDET signal which is proportional to the weight of the DETX signals and the level of the boosting voltage VPP. When the VDET signal is higher than VREF, the HVDET signal output at comparator 314 is at a high level to block the OSC output from oscillator 311. In such case, the output of NOR gate (212) is logic "0" and the charge pumping is stopped and VPP is set to a predetermined non-pump level.

Figure 4:
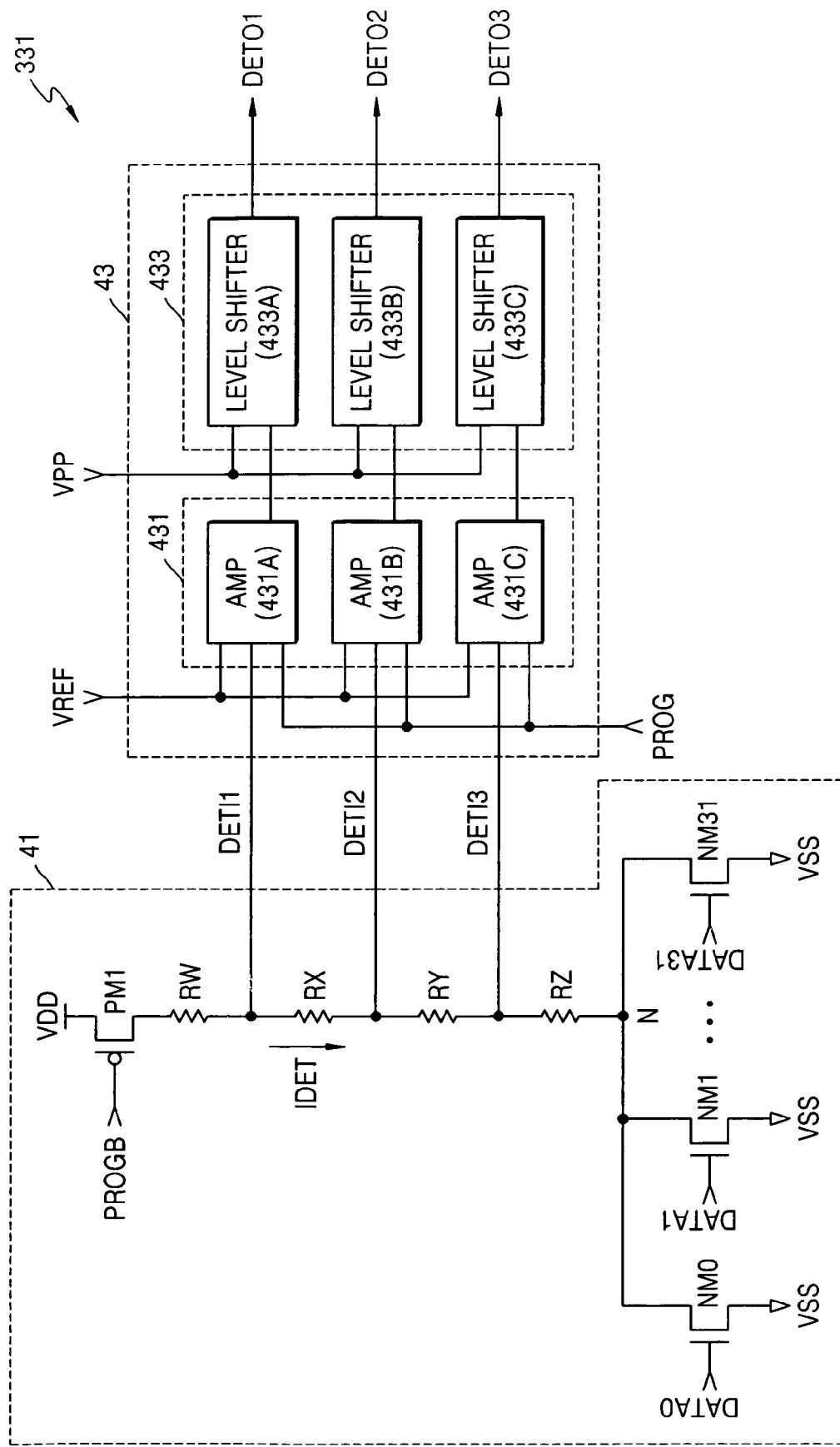
FIG. 4 is a schematic block diagram of the level detector 331 of FIG. 3.

FIG. 4 is a schematic block diagram of the level detector 331 of FIG. 3. The level detector 331 includes a detection voltage generator 41 and a compare circuit 43. The detection voltage generator 41 detects the input data DATA0 to DATA n (in this embodiment, n=31) by use of NM(0) to NM(n) NMOS transistors, with their gates connected to corresponding inputs DATA0 to DATAn, their drains commonly connected to node N and their sources connected to ground or VSS. Upon receipt of an active signal at its gate input, each of the transistors NM0 to NMn presents a lower resistance to node N with respect to ground or Vss. Thus, if a large number of cells are to be programmed, a large number of transistors NM0 to NMn will present as low resistance, and in parallel the resistance presents to node N is even lowered or near zero. Connected to node N through a series of resistors RZ, RY, RX, and RW, and transistor PM1 is the bias voltage VDD. The resistance values for RZ, RY, RX, and RW are preferably 1K, 1K, 2K, and 10K ohms. With such transistor and resistor network, detection voltages DETI1, DETI2, DETI3 are generated at distributed nodes between the series resistors RZ, RY, RX and RW to represent a weight which varies depending on the number of active signals among DATA0 to DATAn. For example, DATA "0" (Inc)=>off NMOS(Inc)=>IDET(Dec)=>Voltage of DET11~DET13(Inc).

The compare circuit 43 includes amplifier 431 and level shifter 433. The amplifier 431 receives the detection voltages (DET1 to 3) and reference voltage VREF for comparison and output to the level shifter 433, wherein VPP is also input to serve as a reference for proper shifting and output of signals (DETO1~DETO3). Data "0" (Inc)=>Voltage of DETI1~DETI3>VREF=>High logic output (DETO1~DETO3). For example, Data "0" (Dec)=>Voltage of DETI1~DETI3<VREF=>Low logic output (DETO1~DETO3).

Figure 5:
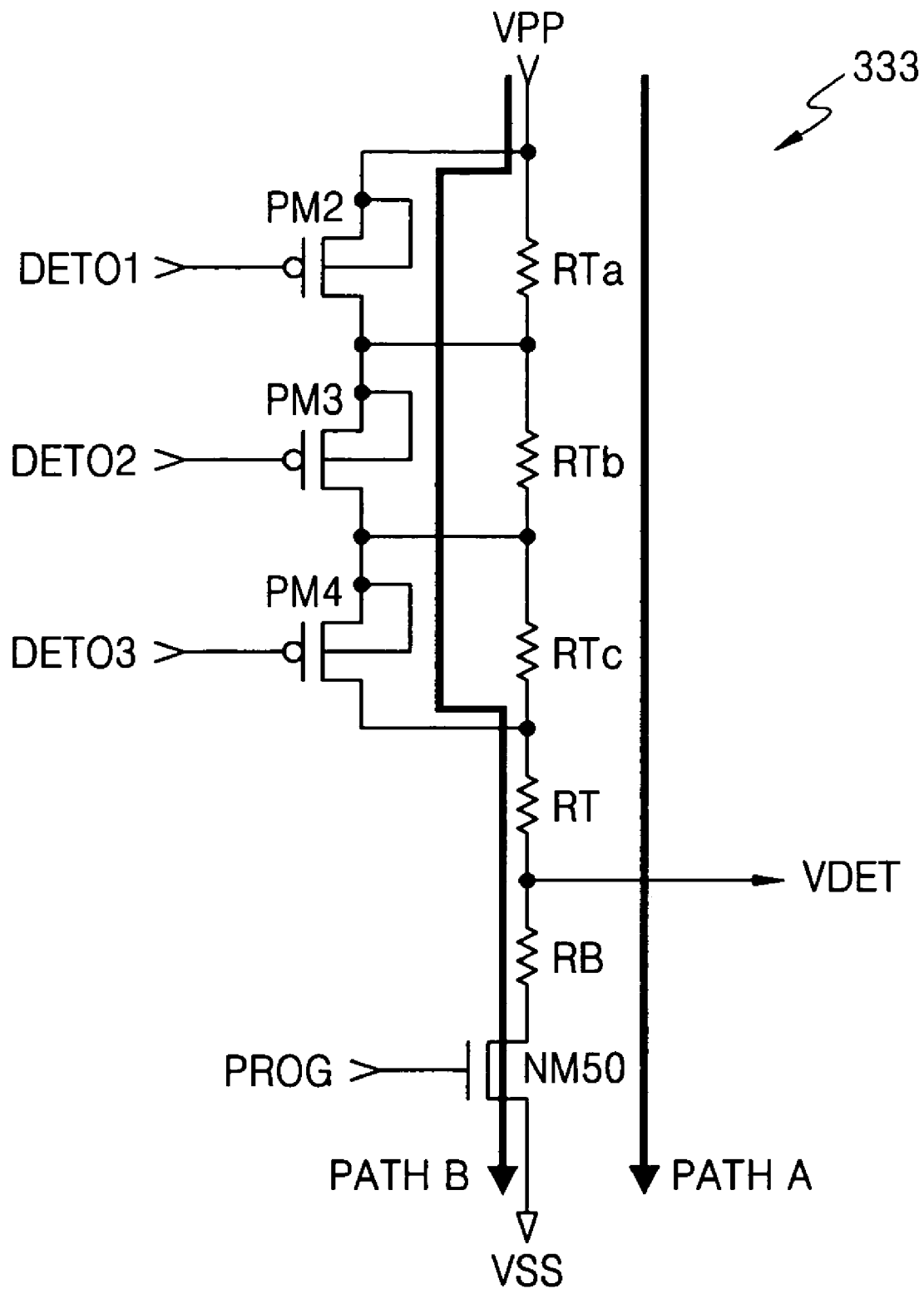
FIG. 5 is a schematic diagram of an exemplary signal generator 333 according to an embodiment of the present invention.

FIG. 5 is a schematic diagram of an exemplary signal generator 333 according to an embodiment of the present invention. The signal generator 333 includes PMOS transistors PM2, PM3, and PM4 for receiving DETO1, DETO2, and DETO3, respectively output from the level detector 331. The transistors PM2 to PM4 are in turn connected to respective transistors RTa, RTb and RTc. When there is a large number of DATA to be programmed "0", a large number of the NM0 to NMn transistors are turned off to present a high resistance at node N. DETO1, O2, O3 are at a high logic level, PM2, 3, 4 are turned-off, current flows through all registers (path A), and VDET is close to VSS or at a low voltage level.

When there is a small number of DATA to be programmed "0", DETO1, 2, 3 are at low logic level, PM2, 3, 4 are turned-on, current flows through the transistors and resistors RT and RB (path B), VDET is closer to boost voltage VPP or at a higher level.

It can be seen that even with the boosting voltage (VPP) held constant, the voltage detect VDET is varied in proportion to the input data DATA0 to DATAn.

Figure 6:
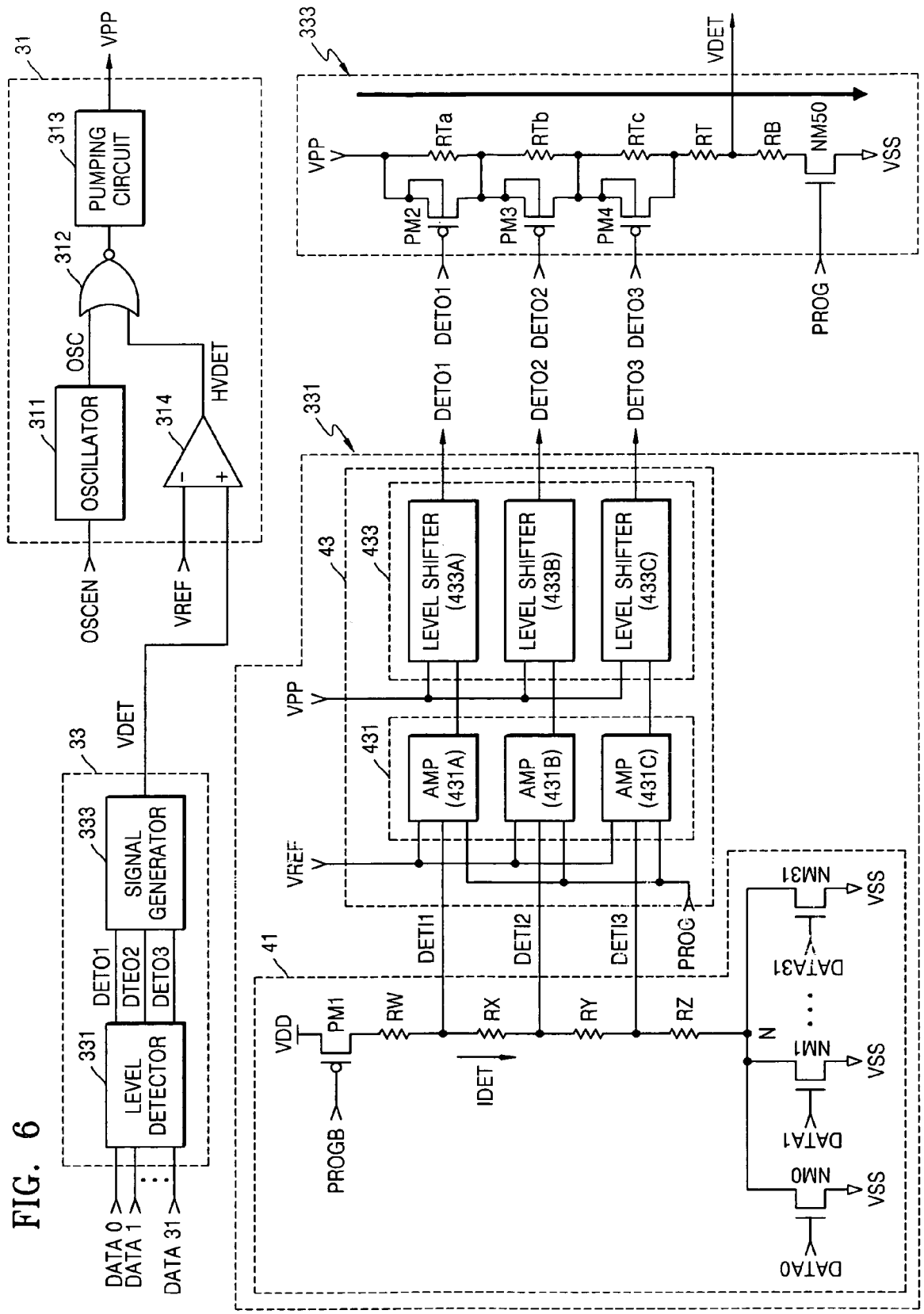
FIG. 6 shows the operation of detector circuit 33 for an instance when the number of DATA to be programmed "0" is 32.

FIG. 6 shows the operation of detector circuit 33 for an instance when the number of DATA to be programmed "0" is 32. All NMOS transistors (NM0~NM31) are turned-off. All detected signals (DETI1, 2, 3) are higher than the VREF. All output signal of level detector is high. All PMOS transistors (PM2, 3, 4) are turned-off. The voltage detect VDET is the lowest given the resistor network at which it is connected. The voltage of VDET can be represented by:

$$[RB/(Rta+RTb+RTc+RT+RB)]*VPP=VDET \quad (1)$$

If the VDET is higher than VREF, the charge pumping is stopped. The boosting voltage VPP is set by the following:

$$[RB/(Rta+RTb+RTc+RT+RB)]*VPP=VDET>=VREF \quad (2)$$

Then, $$VPP=[(Rta+RTb+RTc+RT+RB)]*VREF \quad (3)$$

According to this example, with all 32 cells to be programmed, a large amount of program current is needed and a high boosting voltage VPP is needed. Here, VPP is set at the highest boosting level.

Figure 7:
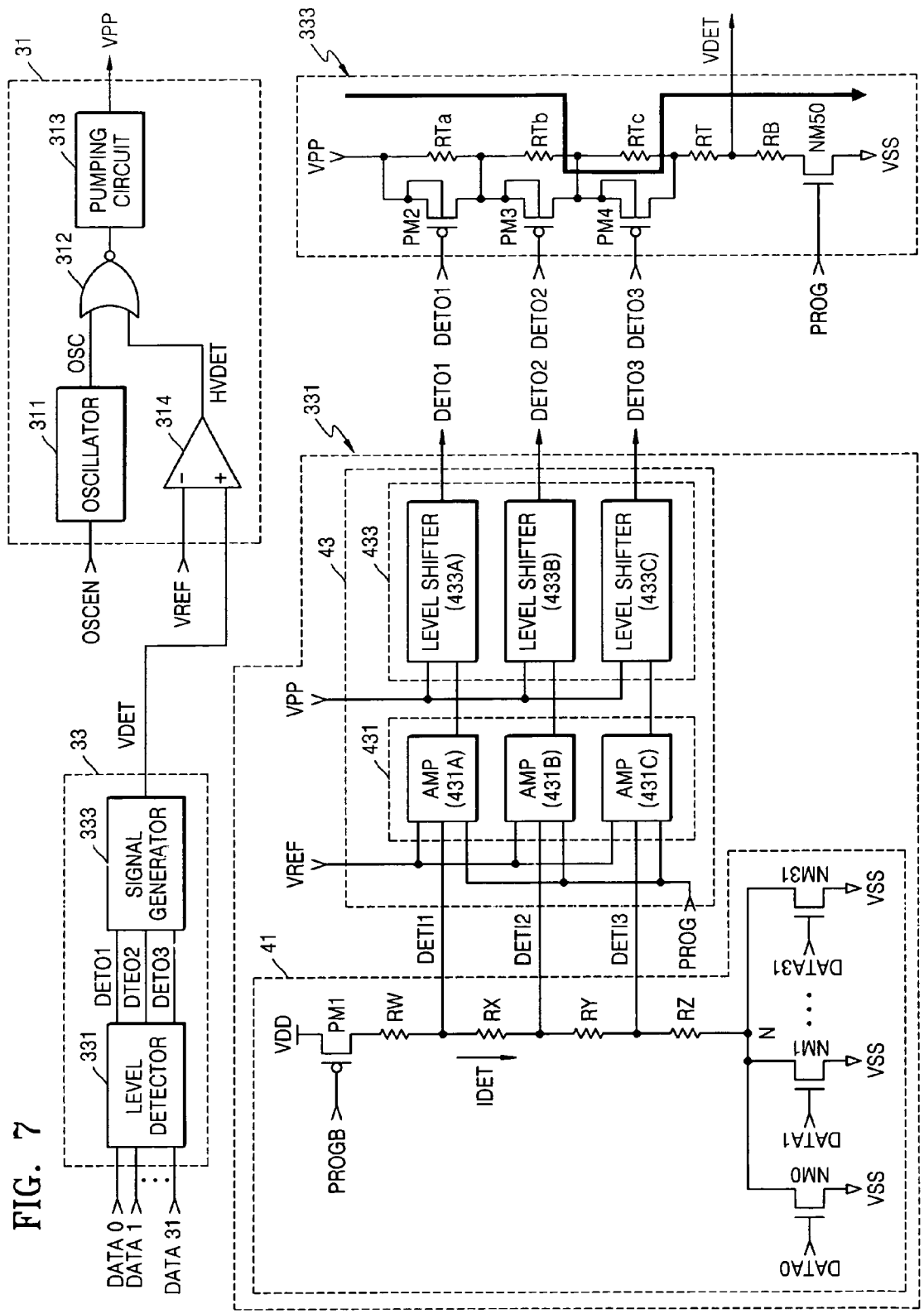
FIG. 7 shows the operation of detector circuit 33 for an instance when the number of DATA to be programmed "0" is 24.

FIG. 7 shows the operation of detector circuit 33 for an instance when the number of DATA to be programmed "0" is twenty-four (24). 24 of DATA0 to DATAn are at a low level and the corresponding 24 NMOS transistors NM0 to NMn are turned-off. 8 of the NM0 to NMn NMOS transistors are left on to yield a relatively low resistance at node N. DETI1 and DETI2 are higher than the VREF, and DETI3 is lower than the VREF. DETO1 and DETO2 are at a high level and DETO3 is at a low level. Only one PMOS transistor (PM4) is turned-on.

The voltage of VDET is:

$$[RB/(Rta+RTb+RT+RB)]*VPP=VDET \quad (4)$$

If the VDET is higher than VREF, the charge pumping is stopped and the VPP is set.

$$[RB/(RTa+RTb+RT+RB)]*VPP=VDET>=VREF \quad (5)$$

Then, $$VPP=[(RTa+RTb+RT+RB)/RB]*VREF \quad (6)$$

According to this example, with 24 cells to be program, a somewhat larger but not the largest boosting voltage VPP is needed and it is provided pursuant to the voltage division network as described in Equation (6).

Figure 8:
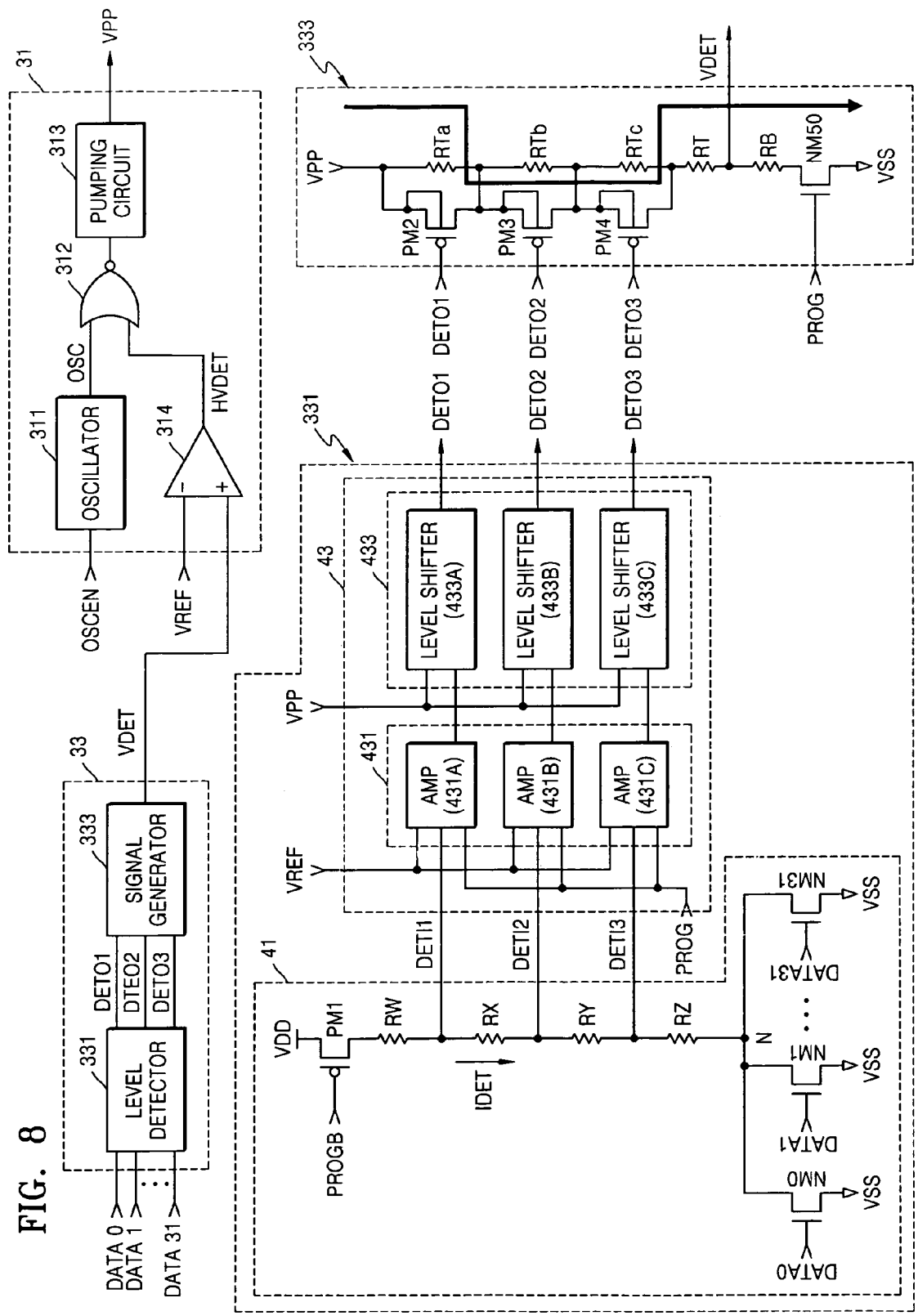
FIG. 8 shows the operation of detector circuit 33 for an instance which the number of DATA to be programmed "0" is 16.

FIG. 8 shows the operation of detector circuit 33 for an instance which the number of DATA to be programmed "0" is 16. 16 NMOS transistors are turned-off. 16 NMOS transistors are turned-on. DETI1 is higher than the VREF, and DETI2 and DETI3 are lower than the VREF. DETO1 is at a high level and DETO2 and DETO3 are at a low level. Only one PMOS transistor (PM2) is turned-off. The voltage of VDET is $$[RB/(RTa+RT+RB)]*VPP=VDET \quad (7)$$

$$[RB/(RTa+RT+RB)]*VPP=VDET>=VREF \quad (8)$$

If the VDET is higher than VREF, the charge pumping is stopped. The boosting voltage VPP is set at:

$$VPP=[(Rta+RT+RB)/RB]*VREF \quad (9)$$

With 16 cells to be programmed, the boosting voltage should be at the midpoint of its highest and lowest voltage levels, as represented by Equation (9).

Figure 9:
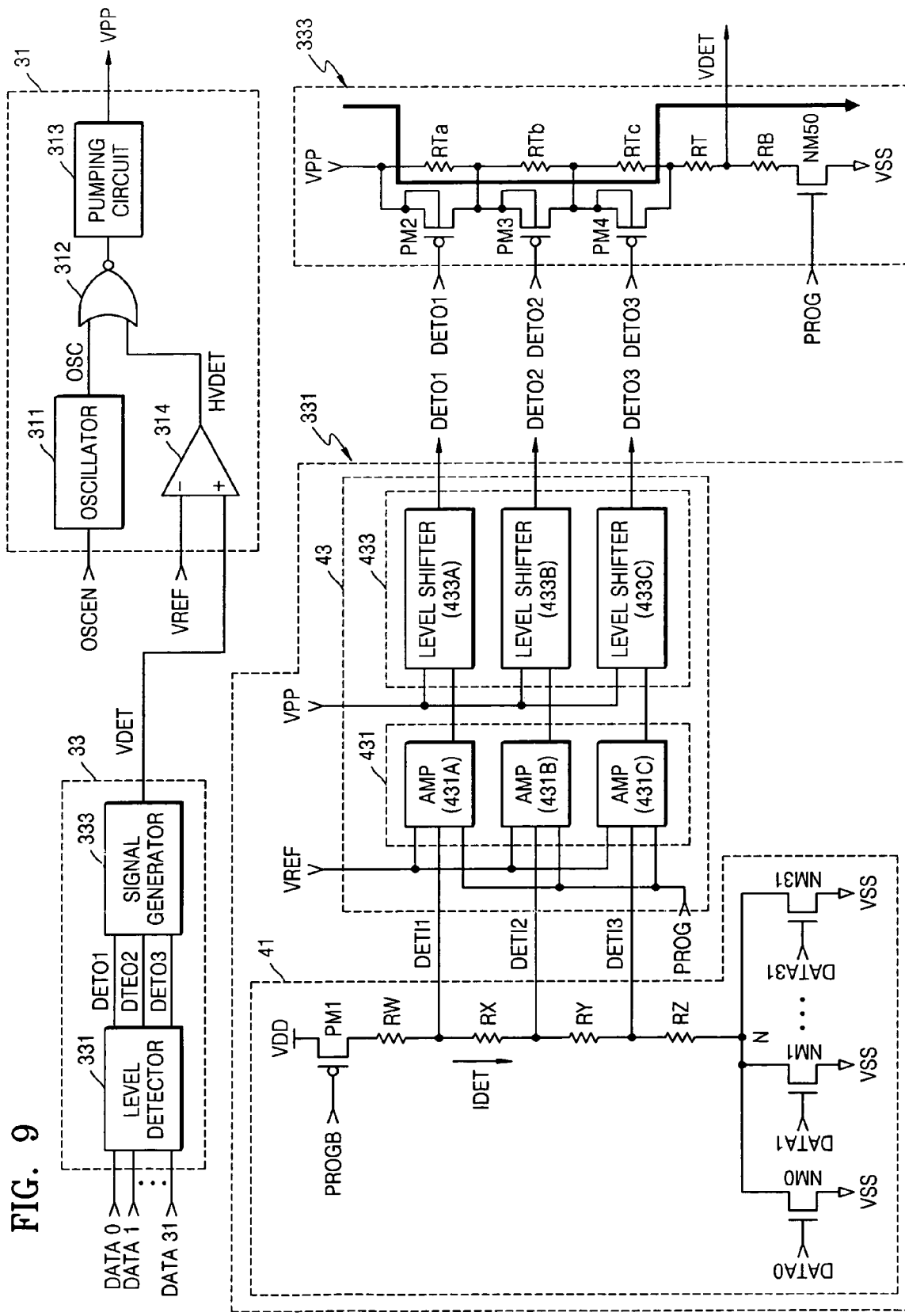
FIG. 9 shows the operation of detector circuit 33 for an instance which the number of DATA to be programmed "0" is 8.

FIG. 9 shows the operation of detector circuit 33 for an instance which the number of DATA to be programmed "0" is 8.

Eight of the NMOS transistors NM0 to NMn are turned-off. 24 of the NMOS transistors remain turned-on. All detected signals (DET11, 2, 3) are lower than the VREF. All output signals DETO1 to O3 of the level detector 331 are low. All PMOS transistors (PM2, 3, 4) are turned-on.

The voltage of VDET is:

$$[RB/(RT+RB)]*VPP=VDET \quad (10)$$

If the VDET is higher than VREF, the charge pumping is stopped.

$$[RB/(RT+RB)]*VPP=VDET>=VREF \quad (11)$$

The boosting voltage VPP is set at:

$$VPP=[(RT+RB)/RB]*VREF \quad (12)$$

According to this embodiment of the invention, the boosting voltage VPP is at a low level to source the program current for eight cells.

Figure 10:
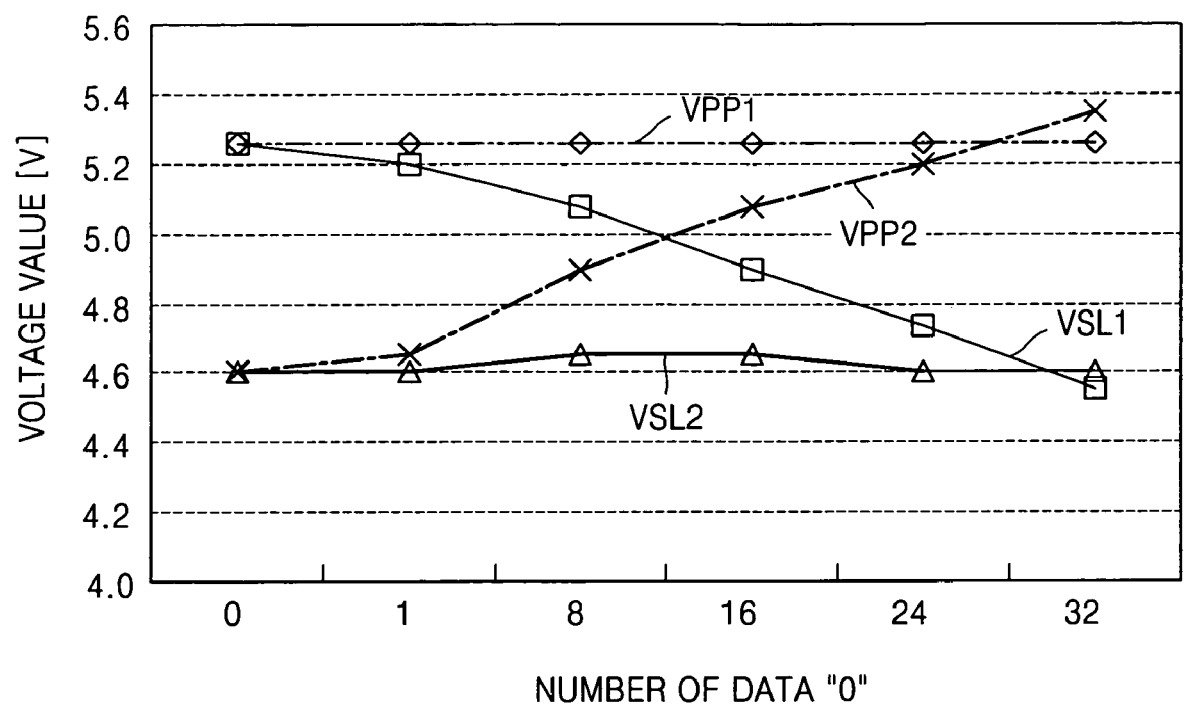
FIG. 10 shows a simulation result of the voltages VPP1, the boosting voltage of conventional structure; VSL1, the source line voltage of conventional structure (variable); VPP2, the boosting voltage provided by a circuit of the present invention; and VSL2, the source line voltage provided to a circuit of the present invention.

FIG. 10 shows a simulation result of the voltages VPP1, the boosting voltage of conventional structure; VSL1, the source line voltage of conventional structure (variable); VPP2, the boosting voltage provided by a circuit of the present invention; and VSL2, the source line voltage provided to a circuit of the present invention. It can be seen that in the conventional boosting circuit, the boosting voltage VPP, remains near constant irrespective of the number of DATA to be programmed "0", while the source line voltage SL1 is decreased as the number of DATA to be programmed "0" increases. According to the present invention, the reverse is seen, e.g., the boosting voltage VPP2 increases as the number of DATA to be programmed "0" increases, while the source line voltage SL2 remains constant.

Having thus described exemplary embodiments of the present invention, it is to be understood that the invention defined by the appended claims is not to be limited by particular details set forth in the above description of exemplary embodiments as many apparent variations thereof are possible without departing from the spirit or scope of the invention as hereafter claimed.

What is claimed is:

1. A circuit for use in a memory device, comprising:
    a level detector that receives a plurality of programming input signals, detects which of the programming input signals are active, and outputs detected signals of varying weight dependant upon the number of programming input signals which are active;
    a signal generator that receives the detected signals from the level detector and outputs a generated signal having a varying voltage level proportional to the varying weight of the detected signals; and
    a voltage booster that controls a voltage level of a bias source based on the generated signal.

2. The circuit of claim 1, wherein the level detector includes: a plurality of input transistors that receive the respective plurality of programming input signals; and a first resistor network that connects to the plurality of input transistors to output at each of a plurality of network nodes a portion of a fixed voltage dependant upon the number of programming input signals which are active.

3. The circuit of claim 2, further including a comparator that connects to the plurality of network nodes, compares the voltage levels at the network nodes against a reference voltage, and outputs the detected signals of varying weight based on the voltage levels at the network nodes.

4. The circuit of claim 1, wherein the signal generator includes a plurality of receiving transistors that receive the respective detected signals, the receiving transistors connect to a second resistor network that is biased by the bias source, the second resistor network having a node that outputs the generated signal.

5. The circuit of claim 1, wherein the voltage booster includes a comparator. that compares the voltage level of the generated signal against a reference voltage to output a compared signal that at one level causes an increase in the voltage of the bias source and at another level does not increase the voltage of the bias source.

6. The circuit of claim 1, wherein the memory is a flash memory.

7. The circuit of claim 6, wherein the flash memory is one of a split gate type and a stack gate type.

8. The circuit of claim 6, wherein the bias source is used to supply current to program the flash memory.

9. The circuit of claim 1, wherein the voltage level of the bias source is increased proportionally as the number of programming inputs which are active increases.

10. A method of controlling a bias source in a memory device, comprising:
    receiving a plurality of programming input signals;
    generating detected signals of varying weight dependant upon the number of programming input signals which are active;
    generating a generated signal having a varying voltage level proportional to the varying weight of the detected signals; and
    controlling a voltage level of the bias source based on the generated signal.

11. The method of claim 10, further including receiving at a plurality of input transistors the respective plurality of programming input signals, the input transistors connect to a resistor network to output at each of a plurality network nodes a portion of a fixed voltage dependant upon the number of programming input signals which are active.

12. The method of claim 11, further including comparing the voltage levels at the network nodes against a reference voltage, and generating the detected signals of varying weight based on the voltage levels at the network nodes.

13. The method of claim 10, further including receiving at a plurality of receiving transistors the respective detected signals, the receiving transistors connect to a resistor network that is biased by the bias source, the resistor network having a node that outputs the generated signal.

14. The method of claim 10, wherein the controlling the voltage of the bias source further comprising comparing the voltage level of the generated signal against a reference voltage to output a compared signal that at one level causes an increase in the voltage of the bias source and at another level does not increase the voltage of the bias source.

15. The method of claim 10, wherein the memory is a flash memory.

16. The method of claim 15, wherein the flash memory is one of a split gate type and a stack gate type.

17. The method of claim 15, wherein the bias source is used to supply current to program the flash memory.

18. The method of claim 10, wherein the voltage level of the bias source is increased proportionally as the number of programming inputs which are active increases.

19. A circuit for use in a memory device, comprising:
    means for receiving a plurality of programming input signals, detecting which of the programming input signals are active, and outputting detected signals of varying weight dependant upon the number of programming input signals which are active;
    means for receiving the detected signals and outputting a generated signal having a varying voltage level proportional to the varying weight of the detected signals; and
    means for controlling the voltage level of a bias source based on the generated signal.

20. The circuit of claim 19, wherein the memory is a flash memory.

21. The circuit of claim 20, wherein the flash memory is one of a split gate type and a stack gate type.

22. The circuit of claim 20, wherein the bias source is used to supply current to program the flash memory.

23. The circuit of claim 19, wherein the voltage level of the bias source is increased proportionally as the number of programming inputs which are active increases.

24. A circuit for use in a memory device, comprising:
    an input measurer that receives a plurality of programming input signals and
    outputs a generated signal having a varying voltage level in response to the plurality of programming input signals which are active; and a voltage booster that controls a voltage level of a bias source based on the generated signal.

25. The circuit of claim 24, wherein the memory is a flash memory.

26. The circuit of claim 25, wherein the flash memory is one of a split gate type and a stack gate type.

27. The circuit of claim 25, wherein the bias source is used to supply current to program the flash memory.

28. The circuit of claim 24, wherein the voltage level of the bias source is increased proportionally as the number of programming inputs which are active increases.

* * * * *